(12) United States Patent
Miyabayashi

(10) Patent No.: US 8,754,917 B2
(45) Date of Patent: Jun. 17, 2014

(54) PRINTER

(71) Applicant: Brother Kogyo Kabushiki Kaisha, Nagoya (JP)

(72) Inventor: Hirokazu Miyabayashi, Nagoya (JP)

(73) Assignee: Brother Kogyo Kabushiki Kaisha, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 13/848,818

(22) Filed: Mar. 22, 2013

(65) Prior Publication Data

US 2014/0002567 A1    Jan. 2, 2014

(30) Foreign Application Priority Data

Jun. 29, 2012   (JP) ................... 2012-147084

(51) Int. Cl.
*H02J 7/00* (2006.01)
*B41J 2/32* (2006.01)
*B41J 2/35* (2006.01)

(52) U.S. Cl.
CPC ............ *H02J 7/00* (2013.01); *H02J 2007/004* (2013.01)
USPC ......................................... 347/211; 347/171

(58) Field of Classification Search
CPC ................. H02J 7/00; H01M 10/44
USPC .................................. 347/171, 211
See application file for complete search history.

(56) References Cited

U.S. PATENT DOCUMENTS

2009/0134704 A1*   5/2009   Utsumi ........................ 307/66
2013/0169728 A1*   7/2013   Tanizaki et al. ............... 347/192

FOREIGN PATENT DOCUMENTS

JP    2000092721    3/2000
JP    2002335637    11/2002

* cited by examiner

*Primary Examiner* — Huan Tran
(74) *Attorney, Agent, or Firm* — McCarter & English, LLP

(57) ABSTRACT

The disclosure discloses a printer. The printer comprises a feeder, a driving device, a printing head, a power feed device configured to supply electric power, a battery accommodating part configured to selectively accommodate either one of a primary battery and a secondary battery, a voltage detecting device, an exhaustion determining part configured to determine whether or not a print load voltage has reached a threshold value for exhaustion determination, a notification part configured to perform predetermined notification processing, a first setting part configured to set the threshold value to a first threshold value, a second setting part configured to store a threshold value for constant load voltage determination, a constant load voltage determining part configured to determine whether or not the constant load voltage has reached the threshold value, and a threshold value changing part configured to change the first threshold value to a second threshold value.

6 Claims, 11 Drawing Sheets

PRINTER

CROSS-REFERENCE TO RELATED APPLICATION

The present application claims priority from Japanese Patent Application No. 2012-147084, which was filed on Jun. 29, 2012, the disclosure of which is incorporated herein by reference in its entirety.

BACKGROUND

1. Field

The present disclosure relates to a printer driven by a battery.

2. Description of the Related Art

Printers operating by using a battery have been already proposed so that a user can casually use printers, for example. In this case, repetition of production of printed objects and repetition of discharge of a battery gradually exhaust the battery. Whether the battery has exhausted or not can be determined by setting a predetermined threshold value, for example, and by checking if an output voltage value of the battery changing over time has lowered to the threshold value or not.

Here, there is a case where a plurality of types of batteries is appropriately replaced and used in one and the same printer. In that case, nominal voltages, voltage drop characteristics at the beginning of use, voltage drop characteristics when the battery is exhausted after the use was started, and the like might be different according to the type of the batteries. For example, if a case in which an alkali manganese battery which is a primary battery is used is compared with a case in which a nickel hydrogen battery which is a secondary battery is used, the nominal voltage of the alkali manganese battery is higher than that of the nickel hydrogen battery, while a voltage drop amount of the alkali manganese battery when print load is applied is larger than that of the nickel hydrogen battery. As a result, the voltage while the print load is applied during exhaustion (hereinafter referred to as a "print load voltage" as appropriate) of the alkali manganese battery is likely to be lower than that of the nickel hydrogen battery. Moreover, when use is continued and exhaustion progresses, the above described print load voltage of alkali manganese battery lowers to a limit value in use (so-called lower limit voltage) relatively early, while the print load voltage of nickel hydrogen battery lowers to the above described lower limit voltage relatively slow.

Therefore, when the above described threshold value used for exhaustion determination is set uniformly in accordance with the lower limit voltage on the use of the alkali manganese battery, for example, if the nickel hydrogen battery is actually used, the voltage falls under a recommended final voltage of the nickel hydrogen battery, which may cause an over discharge state in some cases to give a bad influence to the battery. On the contrary, when the above described threshold value is set uniformly in accordance with a recommended final voltage of the nickel hydrogen battery, if the alkali manganese battery is actually used, determination of exhaustion is made although the voltage has not reached the lower limit voltage of the alkali manganese battery and exhaustion has not progressed so much, and an operator cannot use up the battery until sufficient discharge has been made.

As a prior art giving consideration to the use of the plurality of types of batteries as described above is known. In this prior art, a battery voltage is detected in both a state in which power is not supplied from a battery to a print head, a motor or the like and no load is applied and a state in which power is supplied from the battery to the print head, the motor and the like and a load is applied. Then, the lower limit voltage of a battery attached at that time is determined on the basis of a voltage drop amount in those two states.

However, in the above described prior art, a voltage drop amount is calculated by using only two voltage values, that is, an output voltage value of the battery in a no-load state and an output voltage value of the battery in a load-applied state, the type of the battery (primary battery or secondary battery or the like) is automatically detected by this voltage drop amount, and an exhausted state of the battery is determined by using separate threshold values each corresponding to the detected type of the battery. In this case, if the type of the battery is falsely detected, an inappropriate threshold value is set, and as a result, there is a problem that a degree of exhaustion of the battery cannot be determined with high accuracy.

In order to avoid the above described situation, a method can be considered in which a battery type is manually input by an operator, for example, so that the above described exhaustion determination is made reliably in accordance with the input battery type. However, in this case, the input operation by the operator is needed at each time of use, which is troublesome, and there may be a possibility that the operator erroneously inputs a type different from an actual battery type.

SUMMARY

The present disclosure has an object to provide a printer which can sufficiently use up a battery while preventing an over discharge state without performing an input operation of the battery type by the operator or a detecting operation of the battery type itself on the device side if a plurality of types of batteries is replaced as appropriate and used.

In order to achieve the above-described object, according to the aspect of the present application, there is provided a printer comprising a feeder configured to feed an object to be printed, a driving device configured to control driving of the feeder, a printing head including a plurality of driving elements driven upon power-feed, a power feed device configured to supply electric power to at least one of the plurality of driving elements in accordance with print data, a battery accommodating part configured to selectively accommodate either one of a primary battery having a first electromotive voltage and a secondary battery having a second electromotive voltage which is a voltage value lower than the first electromotive voltage, a voltage detecting device configured to detect an output voltage value of the battery accommodated in the battery accommodating part, an exhaustion determining part configured to determine whether or not a print load voltage detected by the voltage detecting device during printing has reached a threshold value for exhaustion determination, a notification part configured to perform predetermined notification processing when it is determined by the exhaustion determining part that the print load voltage has reached the threshold value for exhaustion determination, a first setting part configured to set the threshold value for exhaustion determination to a first threshold value corresponding to a lower limit voltage of the primary battery, a second setting part configured to store a threshold value for constant load voltage determination for determining a constant load voltage detected by the voltage detecting device in a predetermined constant load state, a constant load voltage determining part configured to determine whether or not the constant load voltage has reached the threshold value for constant load voltage determination before it is determined by the exhaustion determining part that the print load voltage has reached the first threshold value as the threshold value for exhaustion determination, and a threshold value changing part configured to change the first threshold value set by the first setting part as the threshold value for exhaustion determination to a second threshold value corresponding to a recommended final voltage of the secondary battery when the determination by the constant load voltage determining part is satisfied.

A printer of the disclosure of the present application has a feeder, a printing head, a power feed device for feeding power to at least one driving element of the printing head, a driving device that controls driving of the feeder, and a battery accommodating part. A desired print corresponding to print data is applied on an object to be printed by the driving element of the printing head, and a printed object is produced. A battery is accommodated in the battery accommodating part, and power supply to the above described power feed device and the driving device is performed by the above described battery.

Repetition of production of the printed object and repetition of discharge of the battery gradually exhaust the battery, and an output voltage value lowers. If a secondary battery is exhausted and the output voltage value lowers to some extent, further discharge from the battery becomes over discharge in some cases and badly affects the battery itself. Therefore, in the printer of the present disclosure, an exhaustion determination unit is provided. The exhaustion determination unit determines if the output voltage value of the battery has lowered to a threshold value for exhaustion determination or not when a print load is applied (when power is supplied to a large number of driving elements, for example). If determination by this exhaustion determination unit is satisfied, predetermined notification processing is executed by a notification part. As a result, the operator can know that the battery has exhausted and should be replaced.

In the disclosure of the present application, the threshold value for exhaustion determination is switched in a form corresponding to a plurality of types of batteries. Specifically, first, the above described threshold value for exhaustion determination is set by a first setting part to a first threshold value corresponding to a lower limit voltage of a primary battery (an alkali manganese battery provided with a high voltage characteristic before the voltage drops and a low voltage characteristic at a print load after the voltage drops in the above described example. The same applies to the following) provided with a first load voltage characteristic and a first after-drop voltage characteristic. As a result, if the primary battery is actually accommodated in the battery accommodating part and used, the notification processing is correctly executed in the vicinity of the lower limit voltage, and thus the primary battery can be sufficiently used up.

On the other hand, when a secondary battery (in the above described example, a nickel hydrogen battery provided with a low voltage characteristic before the voltage drops and a high voltage characteristic at a print load after the voltage drops. The same applies to the following) is actually accommodated in the battery accommodating part and used, if the threshold value is left to be set to the above described first threshold value, there is a concern that the battery may reach an over discharge state as described above. In order to avoid this, it is necessary to switch the above described threshold value for exhaustion determination to a value suitable for the nickel hydrogen battery (a second threshold value which will be described later) at some timing.

Then, in the disclosure of the present application, attention is paid to a difference in a range of the voltage characteristic before the above described voltage drop (specifically the load voltage characteristic under a condition that a predetermined constant load is applied, for example, a standby voltage, a feed voltage, a voltage in uniform printing and the like) between the primary battery and the secondary battery when exhaustion progresses gradually, a threshold value for constant load voltage determination for the above described switching is stored by a second setting part. That is, the second setting part stores the threshold value for constant load voltage determination so that it becomes smaller than a range of the above described load voltage characteristic of the first battery (first load voltage characteristic) and is included in a range of the above described load voltage characteristic of the secondary battery (second load voltage characteristic). Then, if it is determined by a constant load voltage determining part that the output voltage value of the battery has reached the threshold value for constant load voltage determination, a threshold value changing part changes the above described first threshold value set as the above described threshold value for exhaustion determination to the second threshold value corresponding to a recommended final voltage of the secondary battery. Since the threshold value for constant load voltage determination takes a value out of the range of the first load voltage characteristic as described above, if the primary battery is accommodated in the battery accommodating part and used as described previously, the output voltage value of the battery does not reach the threshold value for constant load voltage determination, and the above described threshold value change is not made. Therefore, only if the secondary battery is accommodated in the battery accommodating part, the threshold value is changed to the above described second threshold value when the above described second load voltage characteristic lowers to the threshold value for constant load voltage determination. As a result, since the notification processing is correctly executed in the vicinity of the recommended final voltage of the secondary battery, the secondary battery can be sufficiently used up while the over discharge state is prevented.

As described above, according to the disclosure of the present application, if the plurality of types of batteries are appropriately replaced and used, it is possible to use up the battery sufficiently while preventing the over discharge state without performing an input operation of the battery type by the operator or a detection operation of the battery type itself on the device side.

DETAILED DESCRIPTION OF THE PREFERRED EMBODIMENTS

An embodiment of the present disclosure will be described below by referring to the attached drawings.

In the present embodiment, the present disclosure is applied to a print label producing device 1 as a printer. This print label producing device 1 produces a print label L (See FIG. 5 which will be described later) corresponding to a printed object by cutting a label tape with print on which a desired print has been applied to a predetermined length.

<Outline Configuration of Print Label Producing Device>

First, an outline configuration of this print label producing device 1 will be described by using FIG. 1. In the present embodiment, the terms, front, rear, left, right, up, and down of the print label producing device 1 refer to the directions illustrated in FIGS. 1, 2 and the like.

Figure 1:
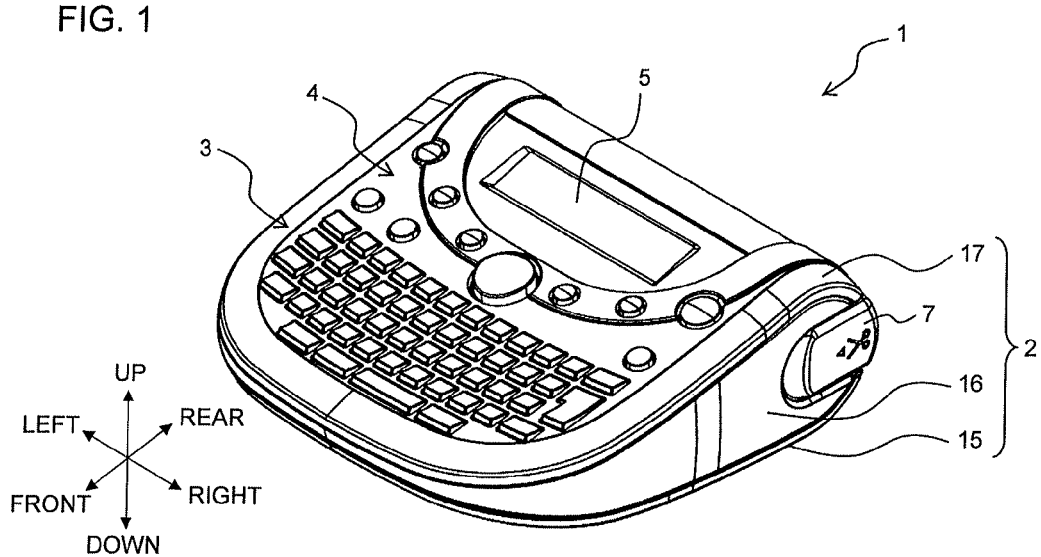
FIG. 1 is a perspective view illustrating an appearance of a print label producing device when seen in a diagonally upward direction.
Figure 2:
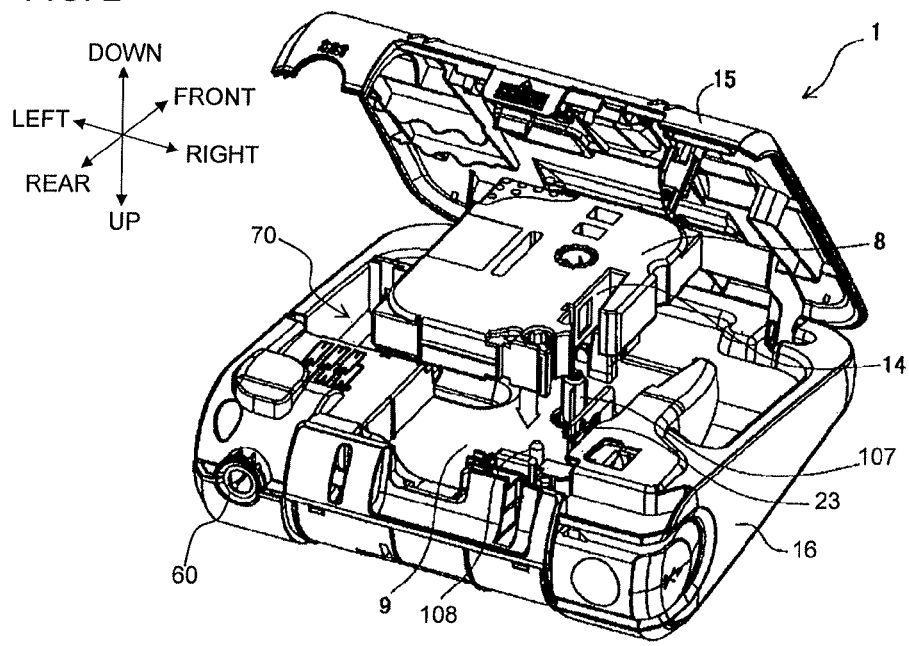
FIG. 2 is a perspective view illustrating an appearance of the print label producing device in a state where a lower cover is open when seen in a diagonally downward direction.

As illustrated in FIGS. 1 and 2, a housing 2 of the print label producing device 1 is composed of a lower cover 15 constituting a lower surface of the device, a lateral cover 16 constituting the side face of the device, and an upper cover 17 constituting an upper surface of the device. On the upper cover 17, a keyboard 3 on which various operations such as character inputs are performed, a functional key group 4 for executing various functions of the print label producing device 1 such as a power switch and a print key, and a liquid crystal display 5 for displaying input characters, symbols and the like are provided from the front to the rear. Moreover, on the rear right side of the lateral cover 16, a cutter lever 7 for cutting a label tape 109 with print (See FIG. 3 which will be described later) is provided.

On the lower rear side of the print label producing device 1, a cartridge holder 9 on which a cartridge 8 can be detachably attached is provided. This cartridge holder 9 is covered when the lower cover 15 formed in an openable and closable manner with a front end portion of the print label producing device 1 as a rotation shaft is closed and exposed when the lower cover 15 is opened.

Moreover, as illustrated in FIG. 2, on the lower rear side of the print label producing device 1, a battery accommodating part 70 is provided which can selectively accommodate a plurality of various batteries BT (See FIG. 4 which will be described later) having the same outer shape and different nominal voltages such as an alkali manganese battery or a nickel hydrogen battery, for example, adjacent to the cartridge holder 9. At this time, each accommodated battery is wired so as to form serial connection. Note that, in the above described example, the alkali manganese battery corresponds to an example of the primary battery having a predetermined electromotive voltage (first electromotive voltage), while the nickel hydrogen battery corresponds to an example of the secondary battery having a predetermined electromotive voltage (second electromotive voltage) lower than the above described first electromotive voltage.

In FIG. 2, reference numeral 60 denotes a DC jack to which an output plug of an AC adapter 220 (See FIG. 4 which will be described later) as an external power supply is connected.

<Cartridge>

Figure 3:
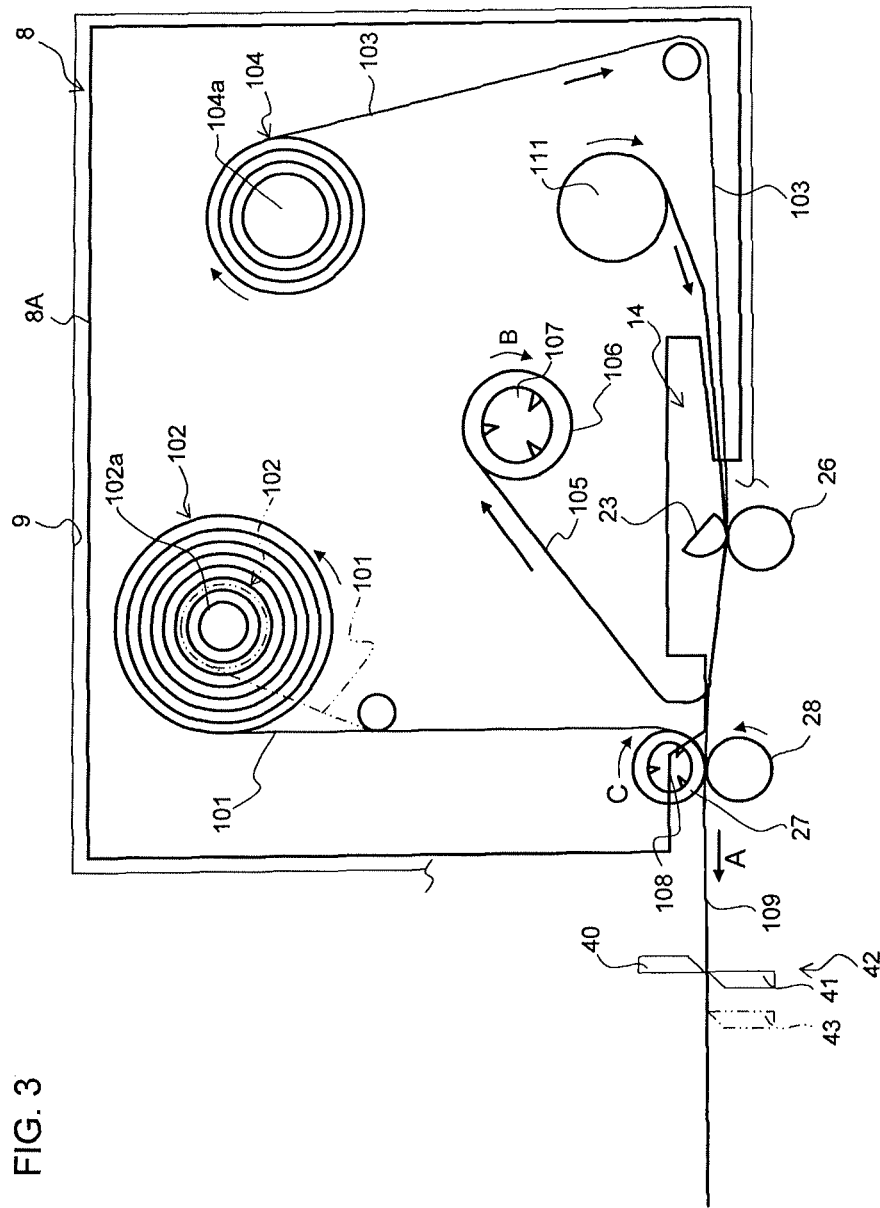
FIG. 3 is an enlarged plan view schematically illustrating an internal structure of a cartridge.

As illustrated in FIG. 3, the cartridge 8 has a housing 8A, a first roll 102 (actually it has a spiral shape but it is illustrated in a concentric shape for simplification in the drawing) arranged in this housing 8A and around which a band-shaped base tape 101 is wound, a second roll 104 (actually it has a spiral shape but it is illustrated in a concentric shape for simplification in the drawing) having substantially the same width as that of the above described base tape 101 and around which a transparent cover film 103 corresponding to an object to be printed of the present embodiment is wound, a ribbon supply side roll 111 for feeding out an ink ribbon 105 (a thermal transfer ribbon however, it is not necessary if a print-receiving tape is a thermal tape), a ribbon take-up roller 106 for taking up the ribbon 105 after printing, and a feeding roller 27 rotatably supported in the vicinity of a tape discharge part of the cartridge 8.

The feeding roller 27 feeds a tape in a direction indicated by an arrow A in FIG. 3 while pressing and bonding the above described base tape 101 and the above described cover film 103 so as to form the above described label tape 109 with print (the roller also functions as a pressure roller).

The first roll 102 has the above described base tape 101 wound around a reel member 102a. The base tape 101 has a four-layer structure in this example, and though not shown in detail, is composed of a bonding adhesive layer made of an appropriate adhesive, a colored base film made of PET (polyethylene terephthalate) and the like, an affixing adhesive layer made of an appropriate adhesive, and a separation sheet laminated in this order from the side wound inward toward the opposite side thereof.

The second roll 104 has the above described cover film 103 wound around a reel member 104a. The ink ribbon 105 is pressed against and brought into contact with the back face of the cover film 103 fed out of the second roll 104 by the thermal head 23 (corresponding to a printing head).

At this time, in correspondence with the configuration of the above described cartridge 8, a ribbon take-up roller driving shaft 107 for taking up the above described used ink ribbon 105 and a feeding roller driving shaft 108 (corresponding to a feeder) for driving the feeding roller 27 for feeding the label tape 109 with print are provided in the cartridge holder 9. Moreover, in the cartridge holder 9, the above described thermal head 23 for applying the desired print on the cover film 103 is provided so as to be located at its opening part 14 when the cartridge 8 is attached.

The ribbon take-up roller 106 and the feeding roller 27 are rotated and driven in conjunction when a driving force of a driving motor 211 (See FIG. 4 which will be described later) which is a pulse motor, for example, provided outside the cartridge 8 is transmitted to the above described ribbon take-up roller driving shaft 107 and the above described feeding roller driving shaft 108 through a gear mechanism, not shown, respectively.

<Outline Operation of Label Producing Device>

In the above described configuration, when the cartridge 8 is attached to the above described cartridge holder 6 and a roller holder is moved from a release position to a print position, the cover film 103 and the ink ribbon 105 are sandwiched between the above described thermal head 23 and a platen roller 26 provided opposite to this thermal head 23. With that movement, the base tape 101 and the cover film 103 are sandwiched between the above described feeding roller 27 and the pressure roller 28 provided opposite to the feeding roller 27. Then, the ribbon take-up roller 106 and the feeding roller 27 are rotated and driven in synchronization in directions indicated by an arrow B and an arrow C in FIG. 3, respectively, by the driving force of the above described driving motor 211. At this time, the previously described feeding roller driving shaft 108 and the above described pressure roller 28 as well as the platen roller 26 are connected by a gear mechanism (not shown), and the feeding roller 27, the pressure roller 28, and the platen roller 26 are rotated along with driving of the feeding roller driving shaft 108, the base tape 101 is fed out of the first roll 102 and is supplied to the feeding roller 27 as described above. On the other hand, the cover film 103 is fed out of the second roll 104, electric power is fed to a plurality of heat generating elements (corresponding to driving elements) provided on the thermal head 23 by a thermal head control circuit 217 (See FIG. 4 which will be described later) and heat is generated. At this time, on the back face side of the cover film 103 (that is, the side to be bonded to the above described base tape), the ink ribbon 105 driven by the ribbon take-up roller 106 is pressed against and brought into contact with the above described print head 23. As a result, on the back face of the cover film 103, print corresponding to the print data having desired contents is printed. Then, the above described base tape 101 and the above described cover film 103 on which the print has been finished are bonded and integrated by the above described bonding adhesive layer by pressing by the above described feeding roller 27 and the pressure roller 28 so as to be formed as the label tape 109 with print and discharged to the outside of the cartridge 8. The ink ribbon 105 having finished print on the cover film 103 is taken up by the ribbon take-up roller 106 by the driving of the ribbon take-up roller driving shaft 107. On the downstream side of a feeding path of the label tape 109 with print discharged to the outside of the cartridge 8, a cutting mechanism 42 provided with a fixed blade 40 and a movable blade 41 is provided. When the above described cutter lever 7 is manipulated, the movable blade 41 is operated, the above described label tape 109 with print is cut, and the print label L is produced.

As indicated by a two-dot chain line in FIG. 3, a half cutter 43 for partially cutting the above described label tape 109 with print in a thickness direction may be provided in addition to the above described cutting mechanism 42. The half cutter 43 cuts all the layers other than the separation sheet in the label tape 109 with print having a five-layer structure of the cover film 103, the bonding adhesive layer, the base film, the affixing adhesive layer, and the separation sheet, that is, the cover film 103, the bonding adhesive layer, the base film, and the affixing adhesive layer in the above described example, for example.

<Control System>

Subsequently, a control system of the print label producing device 1 will be described by using FIG. 4.

Figure 4:
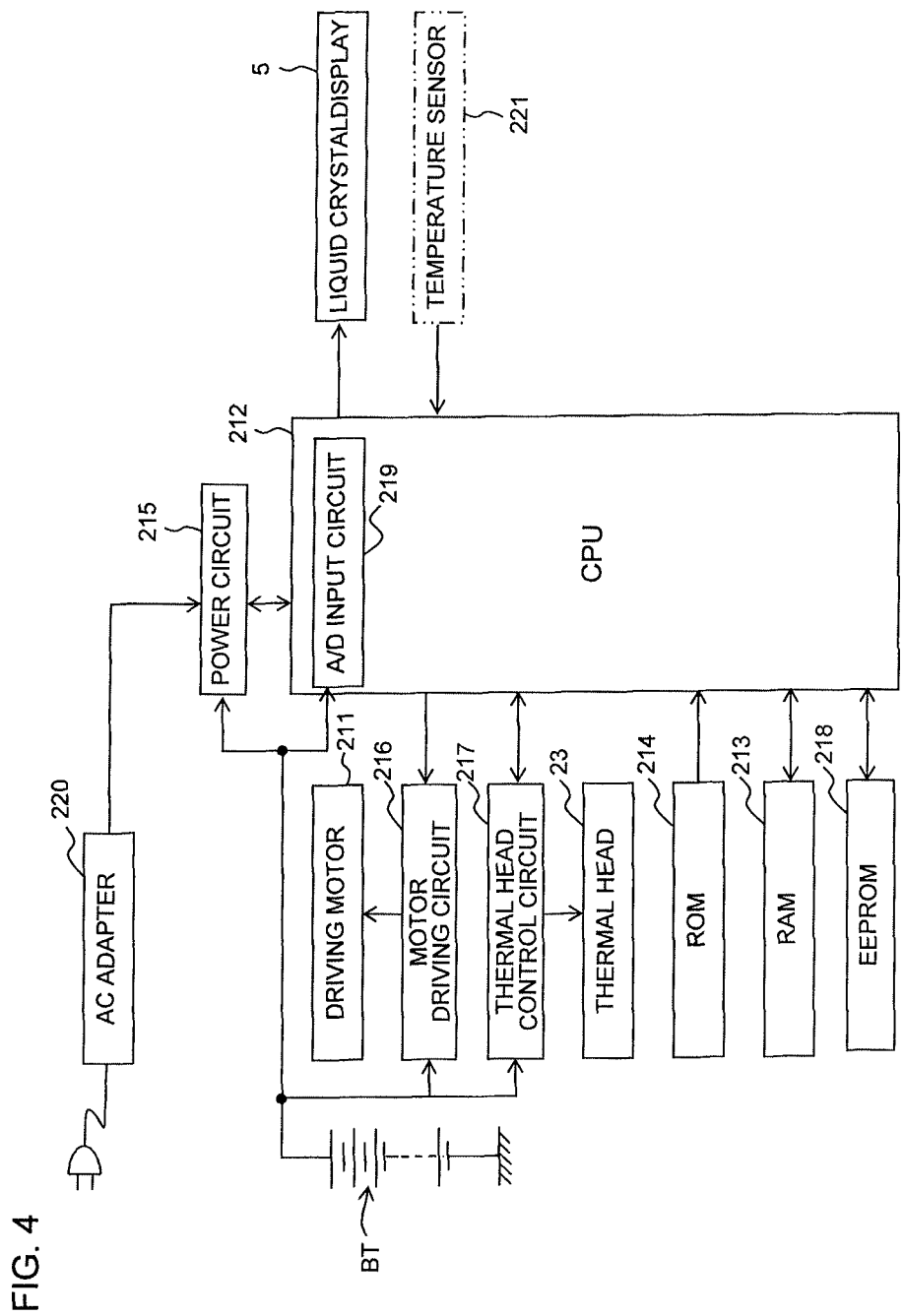
FIG. 4 is a functional block diagram illustrating a control system of the print label producing device.

In FIG. 4, the print label producing device 1 has a CPU 212 constituting a calculation part for carrying out predetermined calculations.

The CPU 212 executes signal processing in accordance with a program stored in advance in a ROM 214 while using a temporary storage function of a RAM 213, and whereby control of the entire print label producing device 1 is made.

Moreover, the CPU 212 is connected to a power circuit 215 connected to the AC adapter 220 and executing power on/off processing of the print label producing device 1, a motor driving circuit 216 (corresponding to a driving device) for executing driving control of the driving motor 211 for driving the above described platen roller 26, and the thermal head control circuit 217 (corresponding to a power feed device) for executing power-feed control of the heat generating elements of the above described thermal head 23.

At this time, an A/D input circuit 219 (corresponding to a voltage detecting device) for measuring (detecting) an output voltage value of a battery BT described previously is provided in the CPU 212. The above described battery BT is connected to this A/D input circuit 219.

Moreover, to the CPU 212, the above described liquid crystal display 5, the above described ROM 214, the above described RAM 213, and an EEPROM 218 (corresponding to a second setting part) are connected. The ROM 214 stores a control program for executing various types of processing. The EEPROM 218 stores a threshold value Ths for determining constant load voltage (which will be described later) used for determining a constant load voltage (the standby voltage Vs in a standby state in an example which will be described later) detected in a predetermined constant load state, a threshold value Tbw for determining exhaustion (which will be described later) used for determining an exhausted state of the battery BT and the like.

In the above described basic configuration, a feature of the present embodiment is that appropriate exhaustion degree determination and notification processing can be executed without performing the input operation of the type of the battery BT or automatic detection of the type of the battery BT on the basis of the behavior of the output voltage value of the battery BT. The details will be described below in order.

<General Behavior of Voltage Fluctuation>

Figure 5:
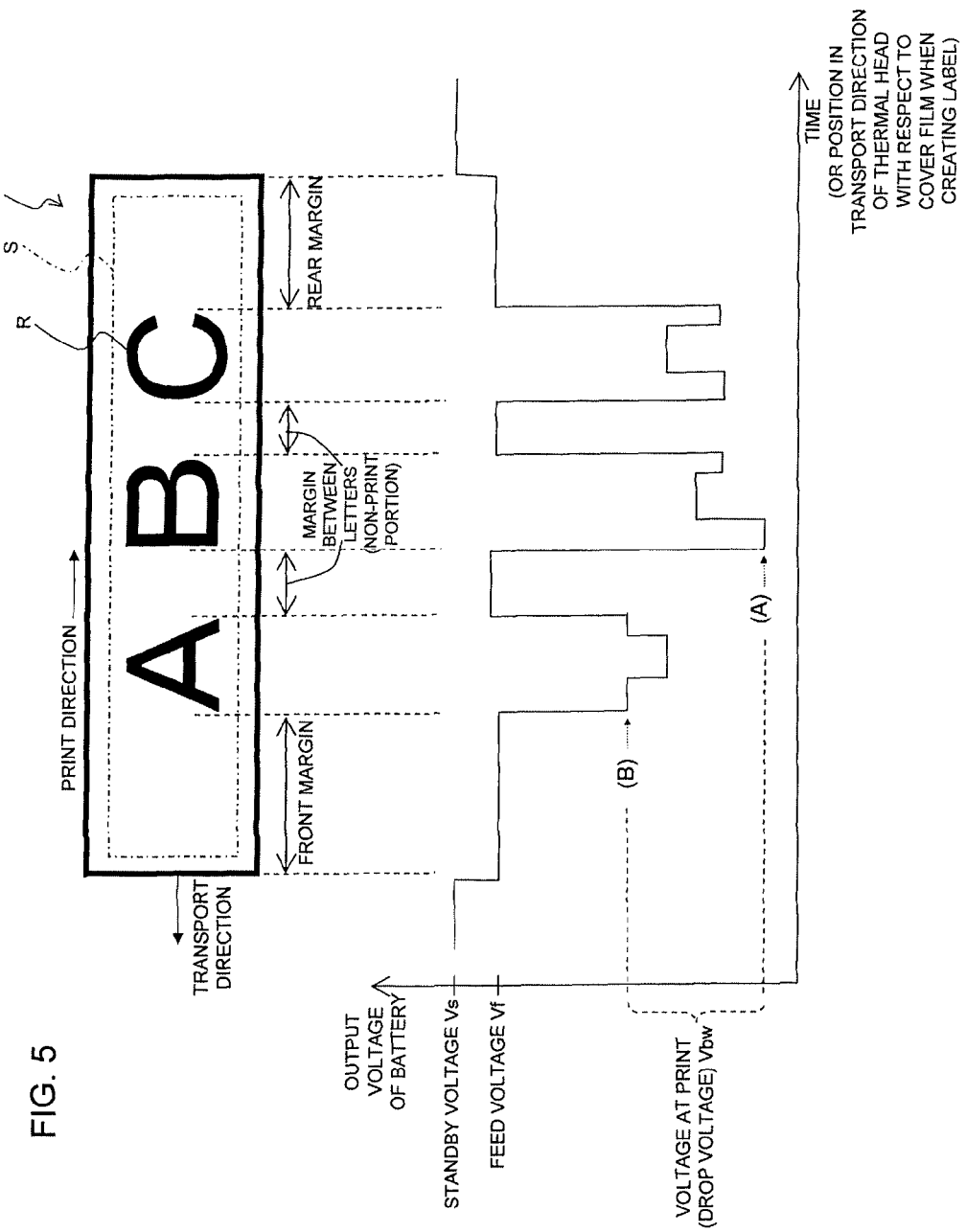
FIG. 5 is a conceptual diagram for explaining a fluctuation behavior of a battery voltage when a single piece of a print label is to be produced.

A change in the output voltage of the battery BT in the print label producing device 1 of the present embodiment operated by using the battery BY as a driving source will be described by using FIG. 5. As illustrated in FIG. 5, in the print label producing device 1, the output voltage value of the battery BT is changed during a production operation of one print label L. That is, in a state where neither of tape transport by the feeding roller driving shaft 108 or print by the thermal head 23 is performed or in other words, in a state where the power is ON and a key input from an operator can be received (standby state), the output voltage of the battery BT becomes a relatively high standby voltage Vs. When production of the print label L is started, first, the feeding roller driving shaft 108 is driven, and transport of a tape such as the cover film 103 is performed (feed state). By means of this transport load, the output voltage of the battery BT is somewhat lowered and becomes a feed voltage Vf. This state continues at least during a period (non-conducted timing) when the thermal head 23 is opposed to an area (front margin) before the plurality of heat generating elements of the thermal head 23 is actually supplied with power and print is started in a print area S set as an area where a desired print R ("ABC" in this example) is formed during production of the print label L.

Furthermore, after transport further progresses, the plurality of heat generating elements of the thermal head 23 are supplied with power, and print of desired figures and characters on the basis of print data is started. In this example, first, an alphabet character "A" in text is printed. The output voltage of the battery BT when the figure or character is printed as above, that is, a print voltage Vbw changes in accordance with the mode of characters to be printed. That is, since the print load becomes larger at timing when the number of heat generating elements supplied with power is large in the heat generating elements aligned in plural in a direction (tape width direction) orthogonal to the transport direction, the print voltage Vbw largely drops and becomes relatively low (See (A) in FIG. 5, for example. The print voltage Vbw will be referred to as "drop voltage Vbw" as appropriate). On the contrary, the print load becomes smaller at timing when the number of heat generating elements supplied with power is small, the print voltage Vbw does not drop so much and the drop voltage Vbw becomes relatively high (See (B) in FIG. 5, for example).

Even after the print on the print area S has started as described above, if it is looked at closely, while the thermal head 23 is opposed to an area (inter-character margin) until the print of the adjacent subsequent text character is started after the print of one text character is finished, the state enters a non-print state where the heat generating elements of the thermal head 23 are not supplied with power. In the example in FIG. 5, the no power-feed timing where the thermal head 23 is opposed to the inter-character margin between the alphabet characters "A" and "B" and the inter-character margin between the alphabet characters "B" and "C" corresponds to this state. At this timing, the output voltage of the battery BT rises again to the feed voltage Vf similar to the timing of the above described front margin. At the timing when the inter-character margin is finished and the print of the subsequent character by the thermal head 23 is started, the output voltage of the battery BT becomes the drop voltage Vbw lower than the feed voltage Vf again.

Then, after the print of all the figures and characters is finished (after the print of the alphabet character "C" is finished in the above described example), power supply to the plurality of heat generating elements of the thermal head 23 is stopped in this area (rear margin) on which print is not applied even in the print area S, and the output voltage of the battery BT becomes the above described feed voltage Vf again during the no power-feed timing when the thermal head 23 is opposed to this area similarly to the above. This state continues until the production of the print label L is finished and the tape transport of the cover film 103 by the driving of the above described feeding roller driving shaft 108 and the like are finished. Note that, the above described standby voltage Vs and the feed voltage Vf both correspond to an example of the constant load voltage. Moreover, the drop voltage Vbw corresponds to the print load voltage.

<Exhaustion Determination of Battery>

If the production of the print label L is repeated and discharge of the battery BT is repeated in the print label producing device 1 as described above, the battery BT is gradually exhausted, and the output voltage value lowers. If the output voltage value lowers to some extent, further discharge from the battery BT becomes over discharge depending on the cases and badly affects the battery BT.

Thus, in the print label producing device 1 of the present embodiment, exhaustion determination of the battery BT is made. That is, it is determined whether or not the output voltage value of the battery BT when a print load is applied (that is, the above described drop voltage Vbw) has lowered to a predetermined threshold value (threshold value for exhaustion determination. The details will be described later). If this determination is satisfied, predetermined notification processing such as corresponding alarm display or the like is executed. As a result, the operator can know that the battery BT has exhausted and should be replaced.

<Difference in Characteristics by Battery Type>

Meanwhile, as already described, in the present embodiment, the plurality of types of the batteries BT (the alkali manganese battery and the nickel hydrogen battery in the previously described example) are replaced as appropriate and used in the battery accommodating part 70. In that case, depending on the type of the battery BT, the nominal voltage, the voltage drop characteristic at the print load at the beginning of use, the voltage drop characteristic at exhaustion after the use is started, and the like might be different.

<Characteristics of Alkali Manganese Battery>

Figure 6A:
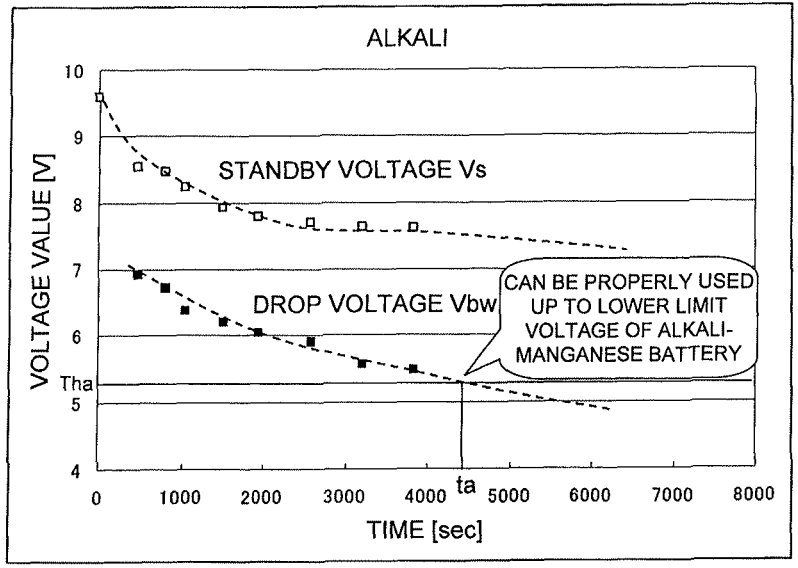
FIG. 6A is an explanatory diagrams illustrating a behavior of an output voltage in a case of an alkali manganese battery.

FIG. 6A illustrates an example of voltage change characteristics when the production of the print label L is repeated by the print label producing device 1 by using six alkali manganese batteries connected in series. The lateral axis indicates cumulative print time used and the vertical axis indicates the output voltage value [V] of the battery.

In FIG. 6A, in an unused state, the standby voltage Vs of the alkali manganese battery is approximately 9.5 [V] and lowers as exhaustion of the battery progresses from the start of use, but the degree of lowering gradually becomes gentle. At the cumulative print time of approximately 2500 [sec] and after, a characteristic line (first load voltage characteristic) of the standby voltage Vs gradually decreases almost in a flat state. On the other hand, the drop voltage Vbw appearing after the voltage drop from the standby voltage Vs by the previously described print load is approximately 7 [V] immediately after the start of use, and the voltage drop amount from the above described standby voltage Vs is approximately 1.5 [V] to 2.5 [V]. As exhaustion of the battery progresses, the characteristic line (first voltage characteristic after drop) of the drop voltage Vbw also lowers gradually and similarly to the above. The voltage drop amount at that time expands little by little.

In the illustrated example, in the vicinity of the cumulative print time of 4000 [sec], the standby voltage Vs becomes approximately 7.7 [V] and the drop voltage Vbw becomes approximately 5.5 [V]. Therefore, in this case, by setting the previously described threshold value (indicated as "Tha" in the figure) to approximately 5.3 [V] (corresponding to the cumulative print time ta) for exhaustion determination of the alkali manganese battery, for example, the alkali manganese battery can be correctly used up to the lower limit voltage.

<Characteristics of Nickel Hydrogen Battery>

Figure 6B:
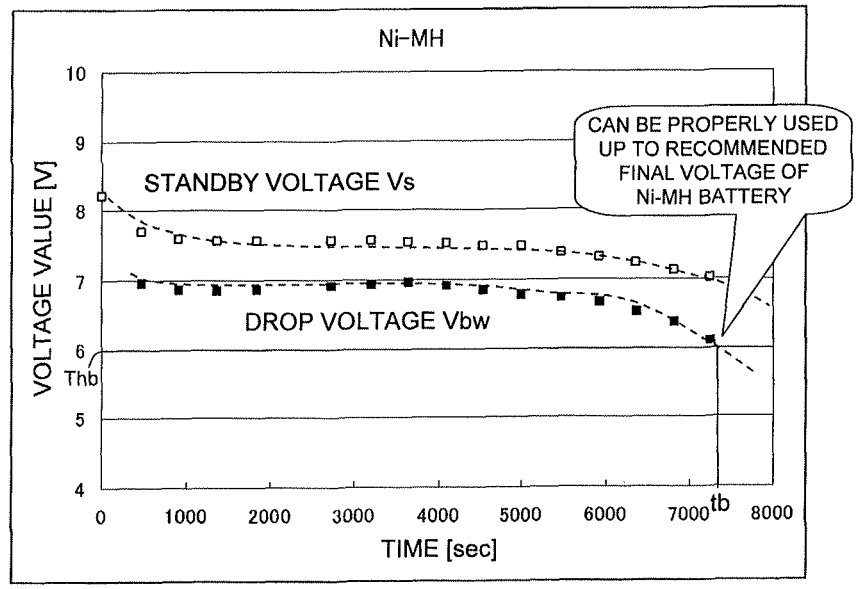
FIG. 6B is an explanatory diagram illustrating a behavior of an output voltage in a case of a nickel hydrogen battery.

FIG. 6B illustrates voltage change characteristics when the production of the print label L is repeated by the print label producing device 1 by using six nickel hydrogen batteries connected in series. Similarly to the above, the lateral axis indicates cumulative print time [sec] and the vertical axis indicates the output voltage value [V] of the battery.

In FIG. 6B, in an unused state, the standby voltage Vs of the nickel hydrogen battery is approximately 8.2 [V] and lowers as exhaustion of the battery progresses from the start of use, but the degree of lowering gradually becomes gentle. The timing comes earlier than that of the above described nickel manganese battery. At the cumulative print time of approximately 1000 used and after, a characteristic line (second load voltage characteristic. This is a voltage value lower than the above described first load voltage characteristic all the time) of the standby voltage Vs gradually decreases almost in a flat state. On the other hand, the drop voltage Vbw appearing after the voltage drop from the standby voltage Vs by the print load similarly to the above is approximately 7 [V] immediately after the start of use. The voltage drop amount from the above described standby voltage Vs is smaller than that of the above described alkali manganese battery and is approximately 0.7 [V]. As exhaustion of the battery progresses, the characteristic line (second voltage characteristic after drop. The voltage value is higher than the above described first voltage characteristic after drop all the time) of the drop voltage Vbw also lowers gradually similarly to the above but the voltage drop amount rarely changes at that time.

In the illustrated example, around when the cumulative print time has exceeded 6000 [sec], the standby voltage Vs becomes approximately 7.2 [V] and the drop voltage Vbw becomes approximately 6.6 [V], and the degree of lowering increases for the both. In this case, by setting the previously described threshold value (indicated by "Thb" in the figure) to approximately 6 [V] (corresponding to the cumulative print time tb) for exhaustion determination of the nickel hydrogen battery, the nickel hydrogen battery can be correctly used up to its recommended final voltage.

<Difficulty of Setting Uniform Threshold Value>

As described above, the voltage change characteristics are considerably different between the case where the alkali manganese battery is used and the case where the nickel hydrogen battery is used. That is, the nominal voltage of the alkali manganese battery is usually higher than that of the nickel hydrogen battery. However, the voltage drop amount (a potential difference between the standby voltage Vs and the drop voltage Vbw) of the alkali manganese battery is larger than that of the nickel hydrogen battery. As a result, the above described drop voltage Vbw of the alkali manganese battery during exhaustion can become lower than that of the nickel hydrogen battery easily. Moreover, when use is continued and the battery is exhausted, the above described drop voltage Vbw of the alkali manganese battery lowers to the above described lower limit voltage (which is a limit value in use) relatively faster, while the drop voltage Vbw of the nickel hydrogen battery lowers to the lower limit voltage (which is a limit value in use) relatively slowly. Moreover, since it is necessary for the nickel hydrogen battery to avoid the over discharge state which extremely quickens deterioration, use below the recommended final voltage should be prohibited particularly in the case of serial connection.

Figure 7A:
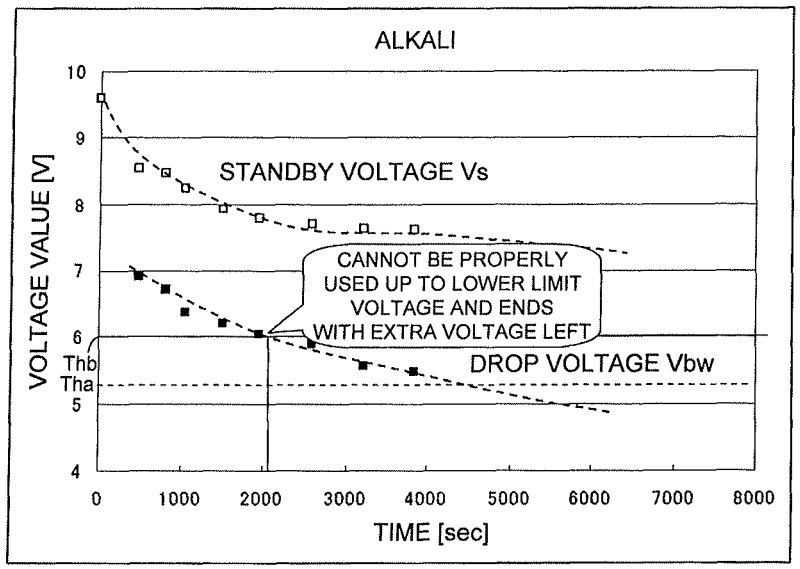
FIG. 7A is an explanatory diagrams when an alkali manganese battery is used in a state where a threshold value for a nickel hydrogen battery is set.

Assuming that, in the label producing device 1, the above described threshold value for exhaustion determination is set uniformly to a value corresponding to the recommended final voltage of the nickel hydrogen battery (Thb=6 [V] in the above described example), for example, an example of a voltage change behavior of the battery BT which is actually an alkali manganese battery in use is illustrated in FIG. 7A. As illustrated, in this case, though the voltage of the alkali manganese battery does not reach the lower limit voltage and is not much exhausted, it is determined that the battery has been exhausted upon reaching the above described threshold value Thb in cumulative print time of approximately 2000 [s]. Therefore, the operator cannot use up the battery BT until it is sufficiently discharged.

Figure 7B:
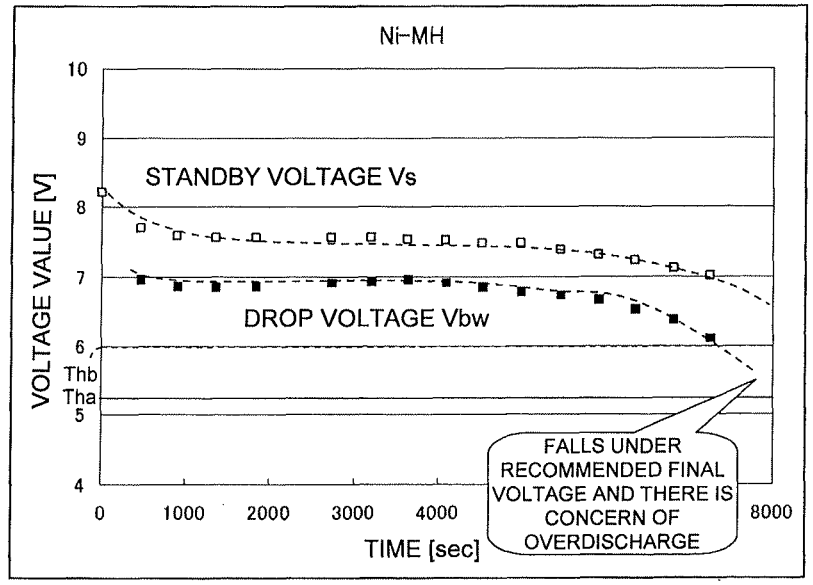
FIG. 7B is an explanatory diagram when a nickel hydrogen battery is used in a state where a threshold value for exhaustion determination for an alkali manganese battery is set.

On the contrary, assuming that, in the label producing device 1, the above described threshold value for exhaustion determination is set uniformly to a value corresponding to the lower limit voltage in use of the alkali manganese battery (Tha=5.3 [V] in the above described example), for example, an example of a voltage change behavior of the battery BT which is actually a nickel hydrogen battery in use is illustrated in FIG. 7B. As illustrated, in this case, the battery is not determined to be exhausted until the voltage falls under the recommended final voltage of the nickel hydrogen battery and reaches the above described threshold value Tha, which causes an over discharge state in some cases and might badly affect the battery BT.

<Method of Exhaustion Notification According to the Present Embodiment>

In order to avoid nonconformity explained by using the above described FIGS. 7A and 7B, there can be a method of inputting a battery type through manual operation of the operator and of switching the above described threshold values Tha and Thb for exhaustion determination in accordance with the input battery type, for example. However, in this case, the above described input operation by the operator is needed at each use, which is troublesome and there is a concern that the operator erroneously inputs a type different from the actual type of the battery BT.

Figure 8:
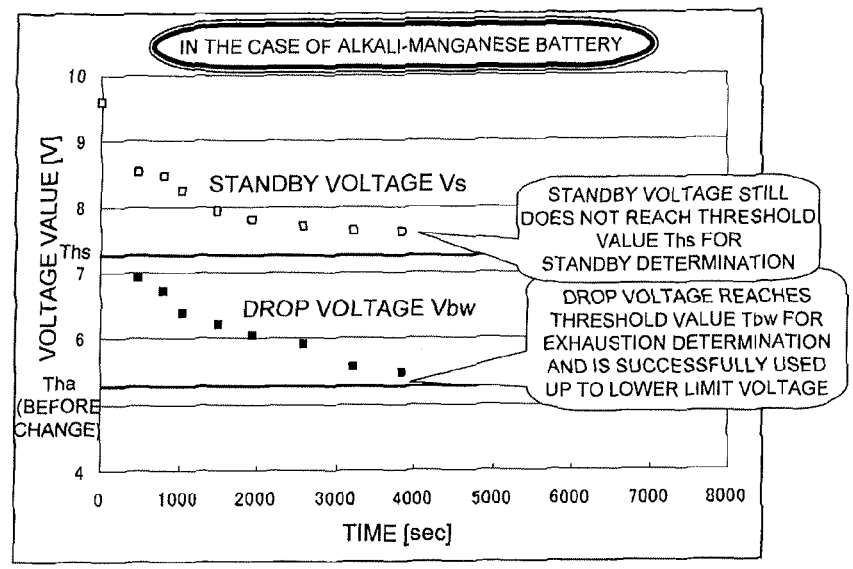
FIG. 8 is an explanatory diagram illustrating a relationship with the threshold value for exhaustion determination when the alkali manganese battery is actually used.

Thus, in the present embodiment, switching of the above described threshold values Tha and Thb for exhaustion determination is carried out (in the present embodiment, these threshold values Tha and Thb to be switched are collectively referred to as a threshold value Tbw for exhaustion determination. See Step S103, Step S18a and the like in the flow in FIG. 11 which will be described later). First, the threshold value Tbw for exhaustion determination is set to the threshold value Tha corresponding to the above described lower limit voltage of the alkali manganese battery provided with the characteristics illustrated in the above described FIG. 6A (Tbw=Tha). As a result, as illustrated in FIG. 8, if the battery BT which is an alkali manganese battery is actually accommodated in the battery accommodating part 70 and used, it is determined that the battery is correctly exhausted in the vicinity of the lower limit voltage, and corresponding notification processing (details will be described later) is executed. As a result, the operator can sufficiently use up the battery BT. The threshold value Ths for determining the standby voltage Vs will be described later.

On the other hand, if the nickel hydrogen battery provided with the characteristics illustrated in the above described FIG. 6B is actually accommodated in the battery accommodating part 70 and used, with the threshold value Tbw for exhaustion determination still being set to the above described threshold value Tha as described above, there is a concern that the determination of exhaustion is not made until the voltage reaches the threshold value Tha and it causes an over discharge state as described previously. In order to avoid this, it is necessary to switch the above described threshold value Tbw for exhaustion determination from the above described threshold value Tha corresponding to the lower limit voltage of the alkali manganese battery to the above described threshold value Thb corresponding to the recommended final voltage of the nickel hydrogen battery at some timing.

Thus, in the present embodiment, an attention is brought to a difference in the range of the voltage characteristics between the alkali manganese battery and the nickel hydrogen battery as illustrated in FIGS. 6A and 6B when exhaustion progresses gradually as described previously. That is, as the threshold value for the above described switching, a predetermined threshold value Ths relating to the standby voltage Vs is set. At that time, the threshold value Ths is set so that it becomes smaller than the range of the standby voltage characteristic line of the alkali manganese battery (See FIGS. 6A and 8) and also the value is included in the range of the standby voltage characteristic line of the nickel hydrogen battery (See FIGS. 6B and 9).

Figure 9:
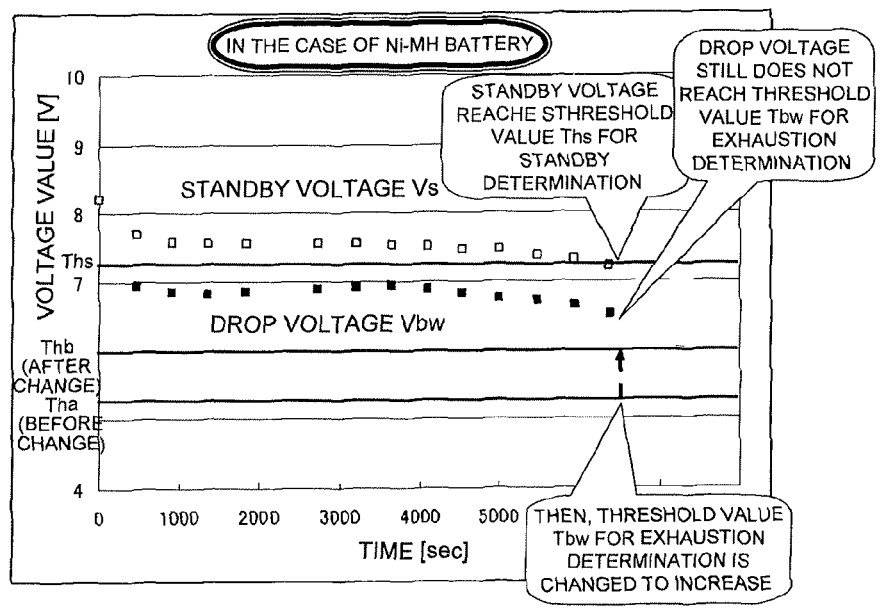
FIG. 9 is an explanatory diagram illustrating a relationship with changing processing of a threshold value for standby determination and the threshold value for exhaustion determination when the nickel hydrogen battery is actually used.
Figure 10:
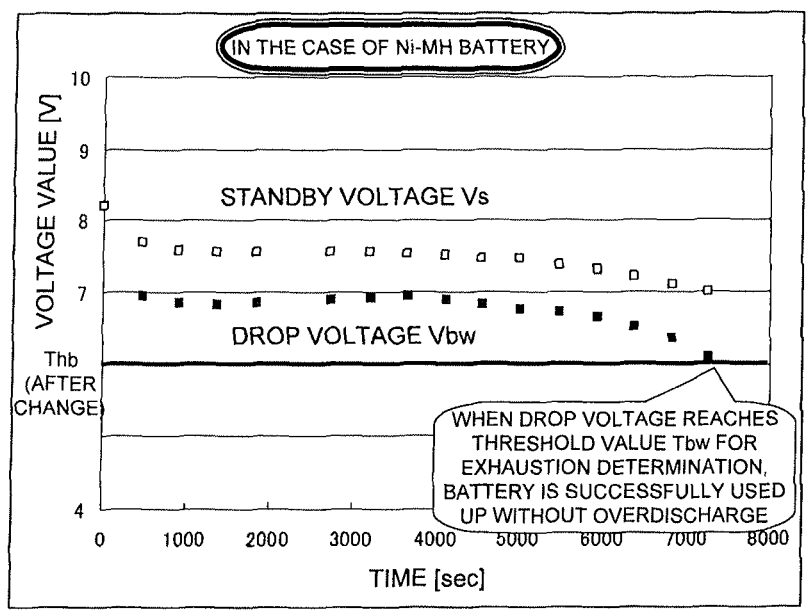
FIG. 10 is an explanatory diagram illustrating a relationship with the changing processing of the threshold value for exhaustion determination when the nickel hydrogen battery is actually used.

Then, if the output voltage value of the battery BT reaches the above described threshold value Ths, the above described threshold value Tbw for exhaustion determination is changed from the above described threshold value Tha to the above described threshold value Thb corresponding to the recommended final voltage of the nickel hydrogen battery (See FIG. 9). Since the threshold value Ths is a value outside the range of the standby voltage characteristic line of the alkali manganese battery as described above, if the alkali manganese battery is accommodated in the battery accommodating part 70 and used as described previously, the output voltage value of the battery BT does not reach the threshold value Ths and enters the exhausted state first (See FIG. 8), and thus, the above described threshold value change is not carried out. Therefore, only if the nickel hydrogen battery is accommodated in the battery accommodating part 70, the threshold value Tha is changed to the threshold value Thb at a stage where the above described standby voltage Vs has fallen to the threshold value Ths. As the result of the change to the threshold value Thb, as illustrated in FIG. 10, it is determined that the battery has been correctly exhausted in the vicinity of the recommended final voltage of the nickel hydrogen battery, and thus, the battery BT which is a nickel hydrogen battery can be sufficiently used up while the over discharge state is prevented.

<Control Procedure>

A processing procedure executed by the CPU 212 in order to realize the method described above will be illustrated in FIG. 11.

Figure 11:
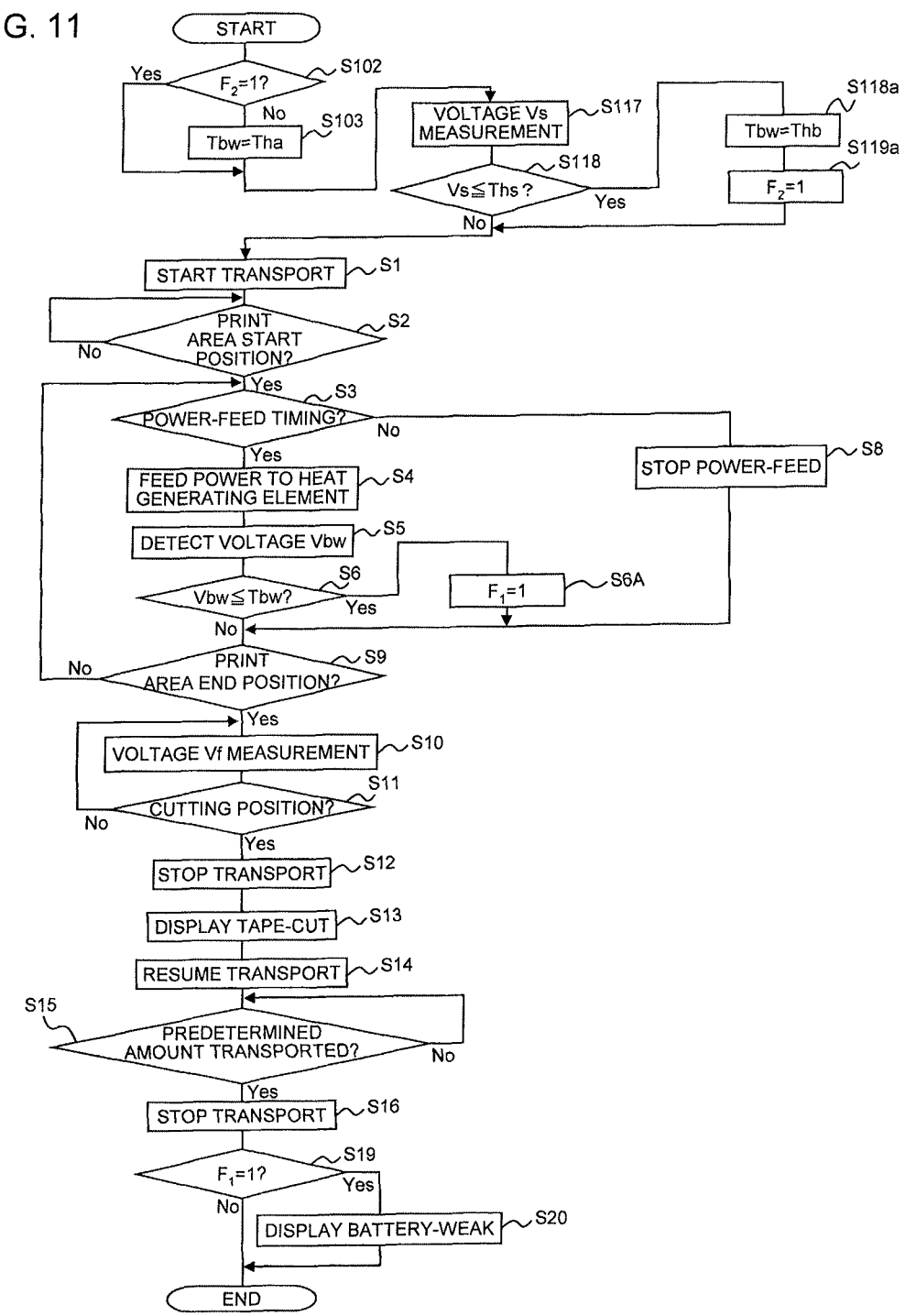
FIG. 11 is a flowchart illustrating a control procedure executed by a CPU.

In FIG. 11, if, for example, the operator operates the functional key group 4 as appropriate and inputs characters, symbols and the like to be printed on the print label L and further instructs production of the print label L by operating the above described print key provided in the functional key group 4, this flow is started. First, at Step S102, the CPU 212 determines whether a threshold-value change flag F2 (detailed functions will be described later) is F2=1 or not. This threshold-value change flag F2 is F2=0 in an initialized state all the time and stays in this initialized state unless it is changed to F2=1 at Step S19a which will be described later (the same applies to a battery weak flag F1 whose detailed functions will be described later).

If it is F2=1, the determination at Step S102 is satisfied (S102: YES), the routine proceeds to Step S1 which will be described later. If it is not F2=1, the determination at Step S102 is not satisfied (S102: NO), and the routine proceeds to Step S103.

At Step S103, the CPU 212 sets the threshold value Tbw for exhaustion determination for determining that the battery BT is in the exhausted state to the threshold value Tha (corresponding to the first threshold value) corresponding to the lower limit voltage of the alkali manganese battery stored in the EEPROM 218 and the like in advance. After that, the routine proceeds to Step S117. This procedure at Step S103 functions as the first setting part described in each of the claims.

At Step S117, the CPU 212 detects the output voltage value of the battery BT at this point of time by the A/D input circuit 219. As described previously, either of power-feed to the heat generating elements of the thermal head 23 or tape transport by the driving motor 211 is not carried out at this point of time. Therefore, the output voltage value detected at this time is the above described standby voltage Vs. Then, the routine proceeds to Step S118.

At Step S118, the CPU 212 determines whether the standby voltage Vs detected at the above described Step S117 is not more than the above described threshold value Ths for standby voltage determination (corresponding to the threshold value for constant load voltage determination) determined in advance for executing switching between the threshold values Tha and Thb for exhaustion determination as described previously and set and stored in the EEPROM 218. This procedure functions as the constant load voltage determining part described in each of the claims. If it is Vs>Ths, the determination at Step S118 is not satisfied (S118: NO), and the routine proceeds to Step S1 which will be described later. If it is Vs Tha, the determination at Step S118 is satisfied (S118: YES), and the routine proceeds to Step S118a.

At Step S118a, the CPU 212 sets the threshold value Tbw for exhaustion determination to the previously described threshold value Thb (corresponding to the second threshold value) corresponding to the recommended final voltage of the nickel hydrogen battery (changed from Tha). After that, the routine proceeds to Step S119a. This procedure at Step S118a functions as a threshold-value changing part described in each claim.

At Step S119a, the CPU 212 changes the threshold-value change flag F2 to 1 indicating that the threshold value has been changed as above, and then, the routine proceeds to Step S1.

At Step S1, the CPU 212 outputs a control signal to the motor driving circuit 216 and starts driving of the feeding roller driving shaft 108 and the ribbon take-up roller driving shaft 107 by the driving motor 211. As a result, transport of the cover film 103, the base tape 101, and the label tape 109 with print (hereinafter referred to simply as the "cover film 103 and the like" as appropriate) is started.

After that, at Step S2, the CPU 212 determines whether the cover film 103 and the like being fed have been fed to a start position of a print area S or not (whether the cover film 103 and the like have been fed to a position in a transport direction where the print head 23 is opposite to a front end of the print area S or not). It is only necessary that this determination is made by a known appropriate method such as counting the number of pulses of the above described driving motor 211 composed of a stepping motor, for example, and the like. If the cover film 103 and the like have not been fed to the start position of the print area S, the determination at Step S2 is not satisfied (S2: NO), loop standby is effected, while if the cover film 103 and the like are fed to the start position, the determination at Step S2 is satisfied (S2: YES), and the routine proceeds to Step S3.

At Step S3, it is determined whether or not the timing at this point of time is power-feed timing of the heat generating elements of the thermal head 23 on the basis of the print data generated by the CPU 212 by means of inputs of characters, symbols and the like by the operator described previously. That is, if the position in the transport direction of the cover film 103 being fed is at the timing when the above described thermal head 23 is located at a position where the text characters or figures in the print area S should be printed, it corresponds to the above described power-feed timing, while the other timings do not (corresponding to the no power-feed timing). If it does not correspond to the power-feed timing, the determination at Step S3 is not satisfied (S3: NO), and the routine proceeds to Step S8. If it corresponds to the power-feed timing, the determination at Step S3 is satisfied (S3: YES), and the routine proceeds to Step S4 which will be described later.

At Step S8, a control signal is output to the thermal head control circuit 217, and all the heat generating elements of the thermal head 23 are brought into a state where power-feed is stopped. After that, the routine proceeds to Step S9 which will be described later.

On the other hand, at Step S4, the CPU 212 outputs a control signal to the thermal head control circuit 217, and electric power is fed to at least one heat generating element of the thermal head 23 which should generate heat at this timing in accordance with the above described print data. As a result, ink of the ink ribbon 105 is transferred onto the cover film 103 by the heat generating element having been supplied with power, and corresponding print is formed.

After that, the routine proceeds to Step S5, the CPU 212 detects an output voltage of the battery BT (that is, the above described drop voltage Vbw) at the power-feed timing at print by the A/D input circuit 219 and stores the result in the RAM 213, for example. This drop voltage Vbw is detected each time this Step S5 is repeated when a single piece of the print label L is produced as will be described later.

Then, at Step S6, the CPU 212 compares the drop voltage Vbw detected at Step S5 with the threshold value Tbw for exhaustion determination at this point of time and determines whether it is Vbw Tbw or not. If it is Vbw≤Tbw, the determination is satisfied (S6: YES), and the routine proceeds to Step S6A. Then, at Step S6A, the above described battery-weak flag F1 is changed to 1 corresponding to the exhausted state, and the routine proceeds to Step S9. If it is Vbw>Tbw, the determination is not satisfied (S6: NO), and the routine proceeds to Step S9. This procedure at Step S6 functions as the exhaustion determining part described in each of the claims.

After that, at Step S9, the CPU 212 determines whether the cover film 103 and the like being fed have been fed to an end position of the print area S (whether the cover film 103 and the like have been fed to a position in a transport direction where the print head 23 is opposite to a rear end of the print area S or not). This determination can be also made by means of a known method similarly to the above. The determination at Step S9 is not satisfied until the cover film 103 and the like have been fed to the end position of the print area S (S9: NO), and the routine returns to Step S3, and the similar procedure is repeated. If the cover film 103 and the like have been fed to the end position of the print area S, the determination at Step S9 is satisfied (S9: YES), and the routine proceeds to Step S10.

As described above, while the thermal head 23 is opposed in the print area S, the procedures are executed in the order of Step S3->Step S4->Step S5->Step S6 (->Step S6A)->Step S9->Step S3 . . . at the power-feed timing, while if it is not the power-feed timing, the procedures are executed in the order of Step S3->Step S8->Step S9->Step S3 . . . , and either one of them is repeatedly carried out.

After that, at Step S10, the CPU 212 detects the output voltage value of the battery BT at this point of time by means of the A/D input circuit 219. As described previously, the thermal head 23 has gone out of the print area S at this point of time, the heat generating element is not supplied with power, but only tape transport is carried out, and thus, the output voltage value detected at this time is the previously described feed voltage Vf. The detection of the output voltage value of the battery BT by the A/D input circuit 219 at Step S10 may be carried out between Step S1 and Step S2. As described previously, the cover film 103 and the like have not been fed to the transport position where the thermal head 23 is opposed to the print area S before Step S2, and the heat generating element is not supplied with power and only tape transport is carried out. Therefore, the above described output voltage value detected at this time also becomes the feed voltage Vf similarly to the above.

After that, at Step S11, the CPU 212 determines whether the cover film 103 and the like being fed have been fed to a cutting position set on the label rear end side from the print area S on the basis of the above described print data or not (whether the label tape 109 with print has been fed to a position in the transport direction where the above described movable blade 41 is opposed to the above described cutting position or not). This determination can be also made only by means of a known method similarly to the above described determination. If the cover film 103 and the like have not been fed to the cutting position yet, the determination at Step S11 is not satisfied (S11: NO), and the routine returns to Step S10 and the similar procedures are repeated. If the cover film 103 and the like have been fed to the cut position, the determination at Step S11 is satisfied (S11: YES), and the routine returns to Step S12.

At Step S12, a control signal is output to the motor driving circuit 216, and driving of the feeding roller driving shaft 108 and the ribbon take-up roller driving shaft 107 by the driving motor 211 is stopped. As a result, the transport of the cover film 103, the base tape 101, and the label tape 109 with print is stopped.

After that, at Step S13, a display signal is output to the liquid crystal display 5. As a result, an appropriate display prompting the operator to operate the cutter lever 7 so as to operate the cutting mechanism 42 and to cut the label tape 109 with print is made.

If cutting of the above described label tape 109 with print is made by the operator in correspondence with the display at above described Step S13 (=if the print label L is produced), the routine proceeds to Step S14, the CPU 212 outputs a control signal to the motor driving circuit 216, and the driving of the feeding roller driving shaft 108 and the ribbon take-up roller driving shaft 107 is started again by the driving motor 211. As a result, the transport of the cover film 103, the base tape 101, and the label tape 109 with print is resumed.

Then, at Step S15, after the CPU 212 resumes the transport at the above described Step S14, it is determined whether the transport of the cover film 103 and the like has been made only by a predetermined feeding amount (a sufficient distance for discharging the print label L produced as described above to the outside of the device) determined in advance or not. This determination can be also made only by executing a known method similarly to the above described determination. If the transport has not been made by the predetermined feeding amount, the determination at Step S15 is not satisfied (S15: NO), loop standby is effected, while if the cover film 103 and the like are fed only by the predetermined feeding amount, determination at Step S15 is satisfied (S15: YES), the routine proceeds to Step S16.

At Step S16, similarly to Step S12, the CPU 212 outputs a control signal to the motor driving circuit 216 and stops driving of the feeding roller driving shaft 108 and the ribbon take-up roller driving shaft 107 by the driving motor 211. As a result, the transport of the cover film 103, the base tape 101, and the label tape 109 with print is stopped. After that, the routine proceeds to Step S19.

At Step S19, the CPU 212 determines if it becomes F1=1 by means of the processing at above described Step S6A at this point of time or not (whether the drop voltage Vbw has fallen below the threshold value Tbw for exhaustion determination or not). If it is still F1=0 (that is, if it is Vbw>Tbw), the determination at Step S19 is not satisfied (S19: NO), it is considered that the battery BT attached to the battery accommodating part 70 is not much exhausted, and this flow is finished without executing further processing.

On the other hand, if it is F1=1 (that is, Vbw≤Tbw), the determination at Step S19 is satisfied (S19: YES), it is regarded that the battery BT attached to the battery accommodating part 70 has been exhausted to such a degree requiring attention by the operator, and the routine proceeds to Step S20.

At Step S20, the CPU 212 outputs a display signal to the liquid crystal display 5. As a result, an alarm display indicating that the battery BT currently attached to the battery accommodating part 70 has been exhausted to some degree is given to the operator on the liquid crystal display 5. This Step S20 functions as a notification part described in each of the claims. After that, this flow is finished.

As described above, in the present embodiment, the threshold value Tbw for exhaustion determination is first set to the threshold value Tha corresponding to the alkali manganese battery. Then, in accordance with the comparison between the standby voltage Vs and the threshold value Ths for standby voltage determination, the threshold value Tbw for exhaustion determination is switched to the threshold value Thb corresponding to the nickel hydrogen battery. As a result, if a plurality of types of the batteries BT is replaced as appropriate and used, it is possible to sufficiently use up the battery while preventing the over discharge state without operating an input of the type of the battery BT by the operator or performing a detection operation of the type of the battery BT on the label producing device 1 side.

The present disclosure is not limited to the above described embodiment but is capable of various variations within a range not departing from the technical idea. An example of such variations will be described below in detail.

Figure 12:
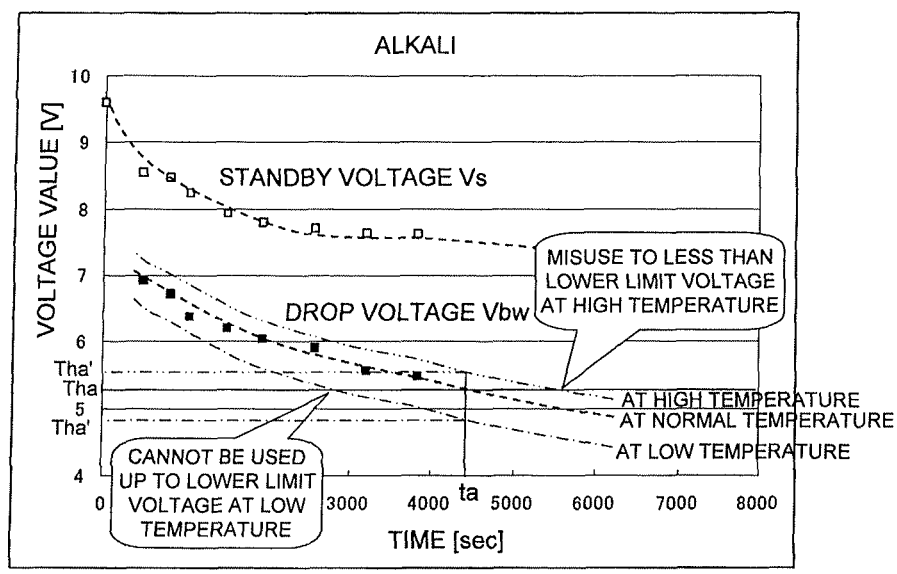
FIG. 12 is an explanatory diagram illustrating a behavior of a change of a drop voltage of the alkali manganese battery due to an environmental temperature.

(1) When threshold value for exhaustion determination is changed in accordance with environmental temperature That is, a voltage drop amount at the above described print load (a potential difference between the standby voltage Vs and the drop voltage Vbw) changes in accordance with a temperature of a peripheral environment in general. That is, as illustrating in FIG. 12 using the characteristic line of the alkali manganese battery as an example, the higher the temperature is, the smaller the above described voltage drop amount becomes, while the lower the temperature is, the larger the above described voltage drop amount becomes. Therefore, if the above described threshold value Tbw for exhaustion determination (the above described threshold value Tha in the case of the alkali manganese battery) set in correspondence with a normal temperature is used as it is at the above described high temperature, as illustrated in FIG. 12, it is likely that the alkali manganese battery is erroneously used to less than the above described lower limit voltage. Similarly, if the above described threshold value Tbw for exhaustion determination set in correspondence with a normal temperature (in the case of the alkali manganese battery, the threshold value Tha) is used as it is at the low temperature, as illustrated in FIG. 12, it is likely that the alkali manganese battery cannot be used up sufficiently to the above described lower limit voltage.

In the present variation, therefore, a temperature sensor 221 (corresponding to a temperature detecting device. See a virtual line in FIG. 4) for detecting an environmental temperature of the print label producing device 1 is provided. A detection result of this temperature sensor 221 is input into the CPU 212. The CPU 212 corrects the above described threshold value Tbw for exhaustion determination in accordance with the temperature dependent behavior of the above described voltage drop amount. That is, the higher the environmental temperature detected by the above described temperature sensor 221 is, the threshold value Tbw for exhaustion determination is corrected to a higher value, while the lower the detected environmental temperature is, the threshold value Tbw for exhaustion determination is corrected to a lower value.

However, in the case of the nickel hydrogen battery, the voltage drop amount itself during print load is originally small as described above, and thus, it is more important to prevent the voltage from falling below the recommended final voltage and causing the above described over discharge state. Therefore, the CPU 212 does not correct the above described threshold value Thb relating to the nickel hydrogen battery regardless of the environmental temperature detected by the temperature sensor 221 (keeping the threshold value Thb at a constant value) while correcting the threshold value Tha relating to the alkali manganese battery as above.

The processing procedure executed by the CPU of the present variation in order to carry out the above described contents will be described by referring to FIG. 13. The same reference numerals are given to portions equal to those in the above described FIG. 11, and explanation will be omitted or simplified as appropriate. In the present variation, the control program for executing this processing is stored in the ROM 214.

Figure 13:
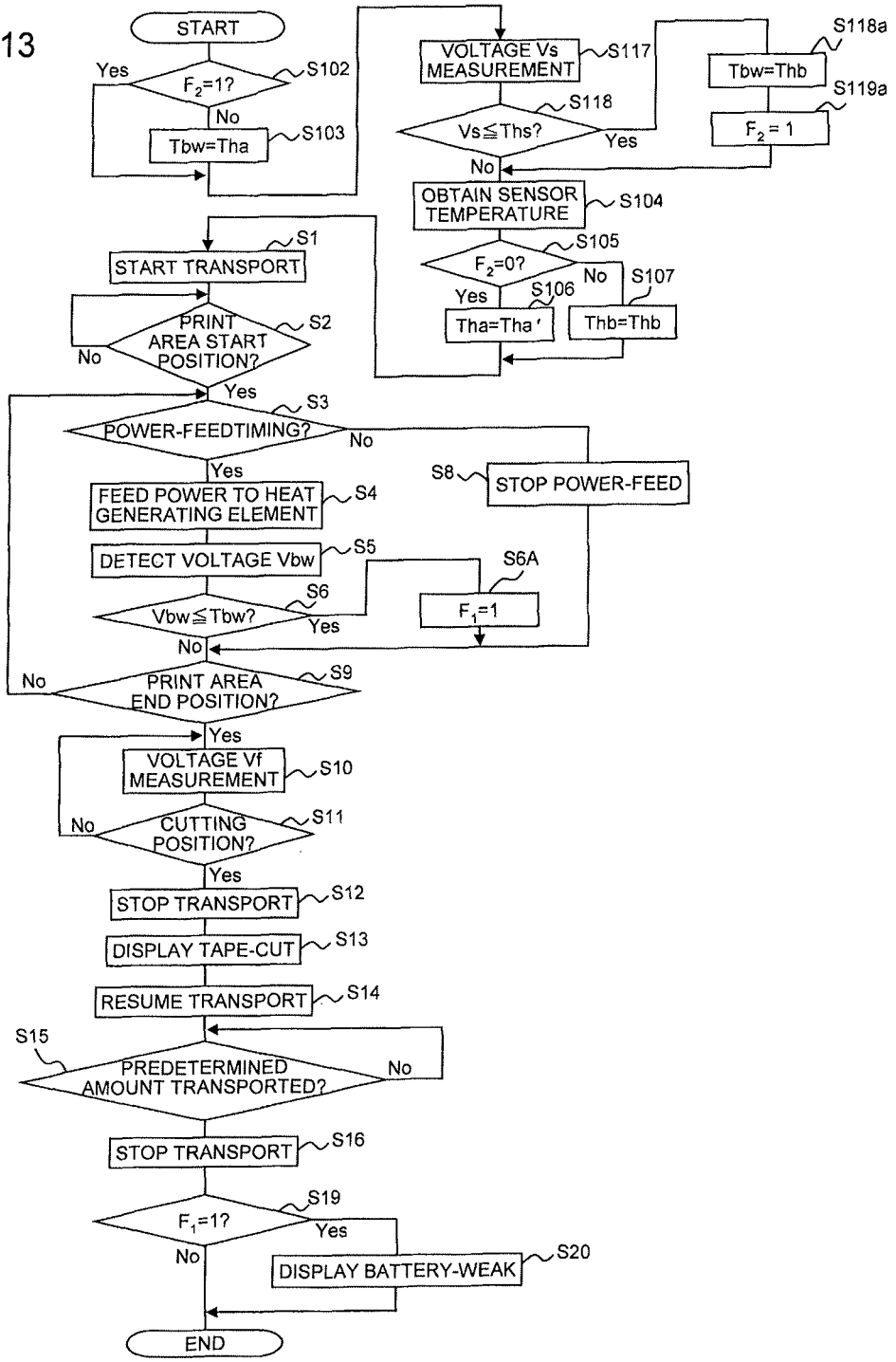
FIG. 13 is a flowchart illustrating a control procedure executed by the CPU in a variation in which the threshold value for exhaustion determination is changed by the environmental temperature.

In the flow illustrated in FIG. 13, Step S104, Step S105, Step S106, and Step S107 are newly provided between Step S118 (or Step S119a) and Step S1 in the flow of the above described FIG. 11.

That is, if the determination at the above described Step S118 (or after execution of Step S119a) is not satisfied, the CPU 212 proceeds to the newly provided Step S104.

At Step S104, the CPU 212 obtains the environmental temperature detected by the above described temperature sensor 221. After that, the routine proceeds to Step S105.

At Step S105, the CPU 212 determines whether or not the previously described threshold value change flag F2 is F2=0 (in other words, whether the previously described switching from the threshold value Tha->Thb has been made or not). If it is F2=1 (in other words, if the switching to the threshold value Thb has been already made), the determination at Step S105 is not satisfied (S105: NO), and the routine proceeds to Step S107 which will be described later. If it is F2=0 (in other words, if the switching to the threshold value Thb has not been made), the determination at Step S105 is satisfied (S105: YES), and the routine proceeds to Step S106.

At Step S106, the CPU 212 changes the threshold value Tha to a new threshold value Tha' subjected to temperature correction as described above and sets the value again. That is, by using a table set and stored in the EEPROM 218 and the like (detailed explanation is omitted), for example, the higher the environmental temperature detected by the above described temperature sensor 221 is, the threshold value Tha' is corrected to a higher value, while the lower the detected environmental temperature is, the threshold value Tha' is corrected to a lower value. If the environmental temperature is 30[° C.] or above, Tha'=5.4 [V] is set, if the temperature is 35[° C.] or above, Tha'=5.5 [V] is set, if the temperature is 10[° C.] or below, Tha'=5.3 [V] is set, or if the temperature is 5[° C.] or below, Tha'=5.2 [V] is set, for example. This Step S106 functions as a first threshold value correcting part described in each of the claims. After that, the routine proceeds to the previously described Step S1.

On the other hand, at Step S107, the CPU 212 keeps the threshold value Thb at the same value (without correction) and proceeds to the previously described Step S1. This Step S107 functions as a second threshold value correcting part described in each of the claims.

Since the processing contents at each Step other than the above are equal to those in FIG. 11, the explanation will be omitted.

According to the present variation, even if the environmental temperature of the print label producing device 1 changes, the alkali manganese battery can be sufficiently used up with high accuracy, while the nickel hydrogen battery can be reliably prevented from entering the over discharge state in accordance with the respective characteristics of the batteries BT.

In the above described example, the above described threshold value Thb relating to the nickel hydrogen battery is not corrected regardless of the environmental temperature detected by the temperature sensor 221, but this is not limiting. That is, it may be so configured that the higher the environmental temperature detected by the temperature sensor 221 is, the threshold value Thb is corrected to a lower value, while the lower the detected environmental temperature is, the threshold value Thb for exhaustion determination is corrected to a higher value (that is, the value is corrected so as to be opposite to the threshold value Tha relating to the alkali manganese battery).

(2) If feed voltage or voltage during uniform power-feed printing is used instead of standby voltage Vs:

That is, in the above, the standby voltage Vs in the standby state is used as a constant load voltage detected in a predetermined constant load state for performing switching of the above described threshold value for exhaustion determination, but this is not limiting. That is, a detected voltage when transport is performed in a state where electric power is not fed to the heat generating elements of the thermal head 23 while the previously described transport and print are executed so as to produce a single print label L, that is, the above described feed voltage Vf may be used instead of the standby voltage Vs. Alternatively, instead of the standby voltage Vs, uniform power-feed voltage when transport is carried out in a state in which power is uniformly fed to the plurality of heat generating elements in accordance with predetermined regularity may be used.

In these cases, too, the CPU 212 changes the threshold value similarly to the above described embodiment, by using a difference in the drop characteristics of the above described feed voltage Vf during exhaustion and uniform power-feed voltage or a difference in the voltage drop characteristics from them to the drop voltage Vbw regarding the alkali manganese battery and the nickel hydrogen battery, for example. As a result, whichever type of the battery BT is used, the battery can be sufficiently used up while an over discharge state is reliably prevented.

(3) Others

Moreover, in the above, such method is used that print is applied on the cover film 103 separate from the base tape 101 and they are bonded together, but this is not limiting, and the present disclosure may be applied to a method in which print is applied on a print-receiving tape layer provided in the print tape (bonding is not performed). In this case, the base tape itself constitutes a print-receiving tape for label and also constitutes an object to be printed.

In the above, the case in which the label tape 109 with print for which printing has finished is cut by the cutting mechanism 42 so as to produce a print label is explained as an example, but this is not limiting. That is, it is the case in which label mounts separated in advance to a predetermined size corresponding to the label (so-called a die-cut label. It constitutes an object to be printed of the present variation) are continuously arranged on a tape fed out of the roll. In this case, even without cutting by the above described cutting mechanism 42, after the tape is discharged to the outside of the device, by separating only the label mounts on which the corresponding print R is already applied from the tape, a print label can be produced. The above described embodiment or each variation of the present disclosure may be applied to the print label produced as above.

Moreover, in the above, the case in which the present disclosure is applied to the print label producing device 1 is explained as an example of a printer, but the present disclosure may be applied to printers such as an inkjet printer which forms images or prints characters on normal sheets for print (object to be printed) having the size of A4, A3, B4, B5 and the like, for example. In the case of the inkjet printer, a piezoelectric element provided in a nozzle head and discharging ink upon turning-on corresponds to the above described driving element. In these cases, too, the same effects are obtained.

In the above, arrows illustrated in FIG. 4 indicate an example of the flows of signals and are not intended to limit the flow directions of the signals.

Moreover, the flowcharts illustrated in FIGS. 11 and 13 are not intended to limit the present disclosure to those procedures illustrated in the above described flows but addition, deletion, change of the order and the like are possible within a range not departing from the gist and technical ideas of the disclosure.

Other than those already described above, methods according to the above described embodiment and each variation may be combined in use as appropriate.

Though not particularly exemplified one by one, the present disclosure is put into practice with various changes within a range not departing from the gist thereof.

What is claimed is:

1. A printer comprising:
a feeder configured to feed an object to be printed;
a driving device configured to control driving of said feeder;
a printing head including a plurality of driving elements driven upon power-feed;
a power feed device configured to supply electric power to at least one of said plurality of driving elements in accordance with print data;
a battery accommodating part configured to selectively accommodate either one of a primary battery having a first electromotive voltage and a secondary battery having a second electromotive voltage which is a voltage value lower than said first electromotive voltage;
a voltage detecting device configured to detect an output voltage value of said battery accommodated in said battery accommodating part;
an exhaustion determining part configured to determine whether or not a print load voltage detected by said voltage detecting device during printing has reached a threshold value for exhaustion determination;
a notification part configured to perform predetermined notification processing when it is determined by said exhaustion determining part that said print load voltage has reached the threshold value for exhaustion determination;
a first setting part configured to set said threshold value for exhaustion determination to a first threshold value corresponding to a lower limit voltage of said primary battery;
a second setting part configured to store a threshold value for constant load voltage determination for determining a constant load voltage detected by said voltage detecting device in a predetermined constant load state;
a constant load voltage determining part configured to determine whether or not said constant load voltage has reached said threshold value for constant load voltage determination before it is determined by said exhaustion determining part that said print load voltage has reached said first threshold value as said threshold value for exhaustion determination; and a threshold value changing part configured to change said first threshold value set by said first setting part as said threshold value for exhaustion determination to a second threshold value corresponding to a recommended final voltage of said secondary battery when the determination by said constant load voltage determining part is satisfied.

2. The printer according to claim 1, wherein:

said constant load voltage is a voltage detected by said voltage detecting device in a standby state when none of said feeder or said printing head is operated after power is turned on.

3. The printer according to claim 1, wherein:

said constant load voltage is a voltage detected by said voltage detecting device when said feeding by said feeder is carried out in a state where power is not fed by said power feed device to said driving element during a production operation of a printed object by collaboration between said feeder and said printing head.

4. The printer according to claim 1, wherein:

said constant load voltage is a uniform power-feed voltage at which said feeding by said feeder is carried out in a state where uniform power-feed in accordance with predetermined regularity relating to said plurality of driving elements is performed by said power feed device.

5. The printer according to claim 2, wherein:

said battery accommodating part is configured to selectively accommodate either one of an alkali manganese battery as said primary battery and a nickel hydrogen battery as said secondary battery.

6. The printer according to claim 1, further comprising:

a temperature detecting device configured to detect an environmental temperature of said printer;

a first threshold value correcting part configured to correct to a higher value said threshold value for exhaustion determination set to said first threshold value by said first setting part, the higher said environmental temperature detected by said temperature detecting device is, while to correct to a lower value said threshold value for exhaustion determination set to said first threshold value by said first setting part, the lower said environmental temperature detected by said temperature detecting device is; and a second threshold value correcting part configured to correct said second threshold value changed by said threshold value changing part as said threshold value for exhaustion determination to a lower value, the higher said environmental temperature detected by said temperature detecting device is, while to correct to a higher value, the lower said environmental temperature detected by said temperature detecting device is, or to keep said second threshold value at a constant value regardless of said environmental temperature detected by said temperature detecting device.

* * * * *